United States Patent [19]

Peczalski et al.

[11] Patent Number: 4,996,454
[45] Date of Patent: Feb. 26, 1991

[54] HOT CLOCK COMPLEX LOGIC

[75] Inventors: Andrezj Peczalski, Brooklyn Park; Julio C. Costa; Jeffrey S. Conger, both of Minneapolis, Minn.

[73] Assignee: Honeywell Inc., Minneapolis, Minn.

[21] Appl. No.: 374,196

[22] Filed: Jun. 30, 1989

[51] Int. Cl.$^5$ .................. H03K 19/017; H03K 19/02
[52] U.S. Cl. ........................... 307/480; 307/448; 307/481; 307/482; 307/546; 307/578; 377/49
[58] Field of Search ............... 307/482, 578, 443, 445, 307/448, 450, 546, 480, 481; 377/49

[56] References Cited

U.S. PATENT DOCUMENTS

| | | | |
|---|---|---|---|
| 3,708,688 | 1/1973 | Yao | 307/443 |
| 3,943,377 | 3/1976 | Suzuki | 307/443 |
| 4,562,365 | 12/1985 | Redfield | 307/482 |
| 4,570,085 | 2/1986 | Redfield | 307/578 |
| 4,599,528 | 7/1986 | Redfield | 307/482 |

OTHER PUBLICATIONS

"Hot-Clock nMOS", by C. L. Seitz et al., in Submission Systems Architecture Semiannual Technical Report,; Computer Science, California Institute of Technology, 5178:TR:85, Mar. 1985.
"High Speed dynamic Circuits Implemented with GaAs MESFETs", by L. Yang et al., in IEEE GaAs IC Symposium, pp. 261–264.

Primary Examiner—Stanley D. Miller
Assistant Examiner—Margaret Rose Wambach
Attorney, Agent, or Firm—John G. Shudy, Jr.

[57] ABSTRACT

High speed complex logic circuitry powered solely by clock signals. Such circuitry may be implemented in optical, electrical or other means, involving any medium or substrate as desired.

12 Claims, 4 Drawing Sheets

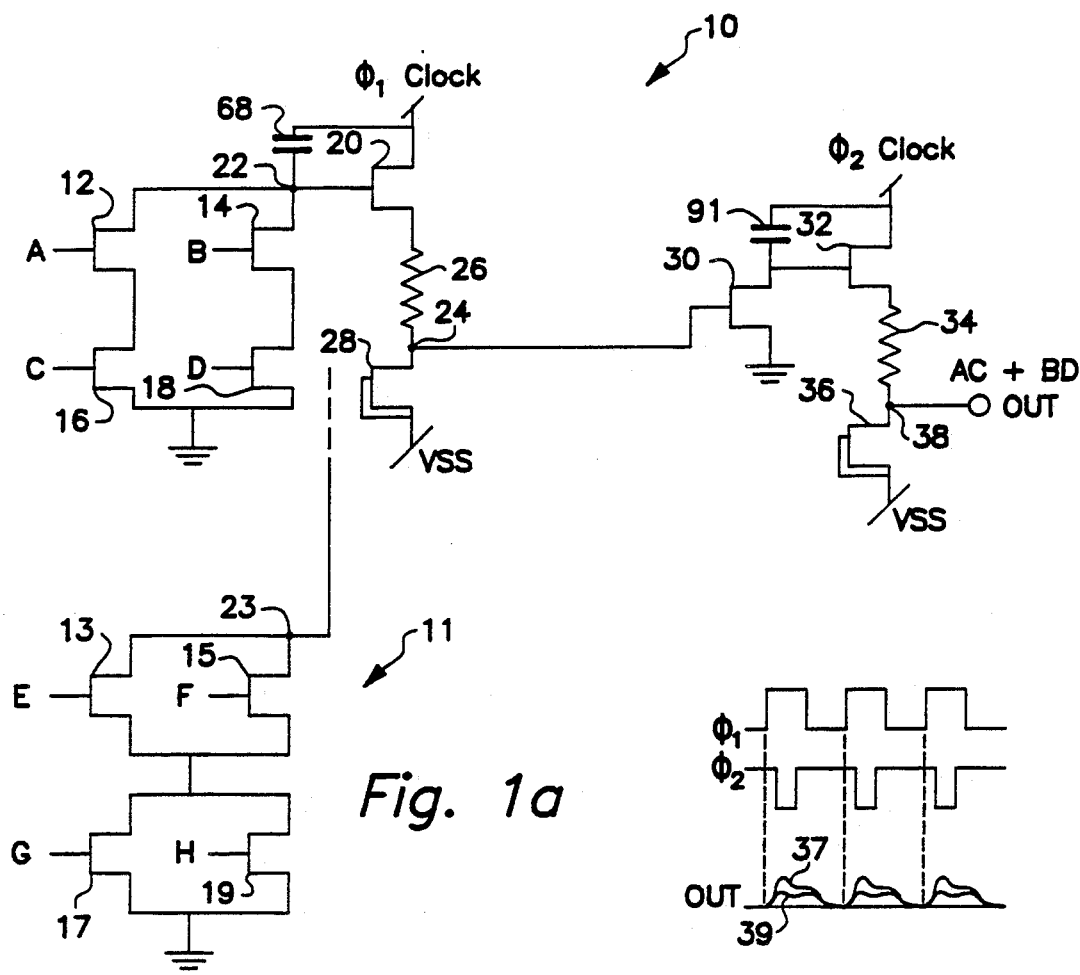
Fig. 1a
Fig. 1b
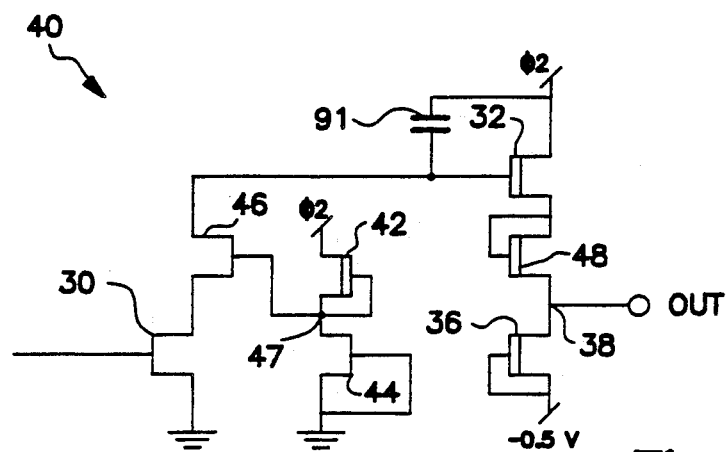
Fig. 2

HOT CLOCK COMPLEX LOGIC

FIELD OF THE INVENTION

The invention pertains to logic circuits and particularly to hot clock logic gates.

BACKGROUND OF THE INVENTION

"Hot clock" (i.e., power is provided by a clock signal) logic gates perform Boolean logic operations at the rising edge of a clock signal and at very high frequencies. Related art as known to the applicants includes hot clock logic that performs only NOR functions.

SUMMARY OF THE INVENTION

The present invention offers the advantages of performing complex Boolean operations (not just NOR functions) at the rising edge of the clock switching at high speeds for ranges of frequencies up to two gigahertz (GHz). The circuit of the invention may be optical as well as electrical. The invention has the advantages of having very high functionality (i.e., tree logic development), being ideal for pipeline architecture, and having simplified timing.

BRIEF DESCRIPTION OF THE DRAWINGS

FIG. 1 is a schematic of an application of the invention.

FIG. 2 is a schematic of an input buffer.

DESCRIPTION OF THE PREFERRED EMBODIMENT

Figure 3:
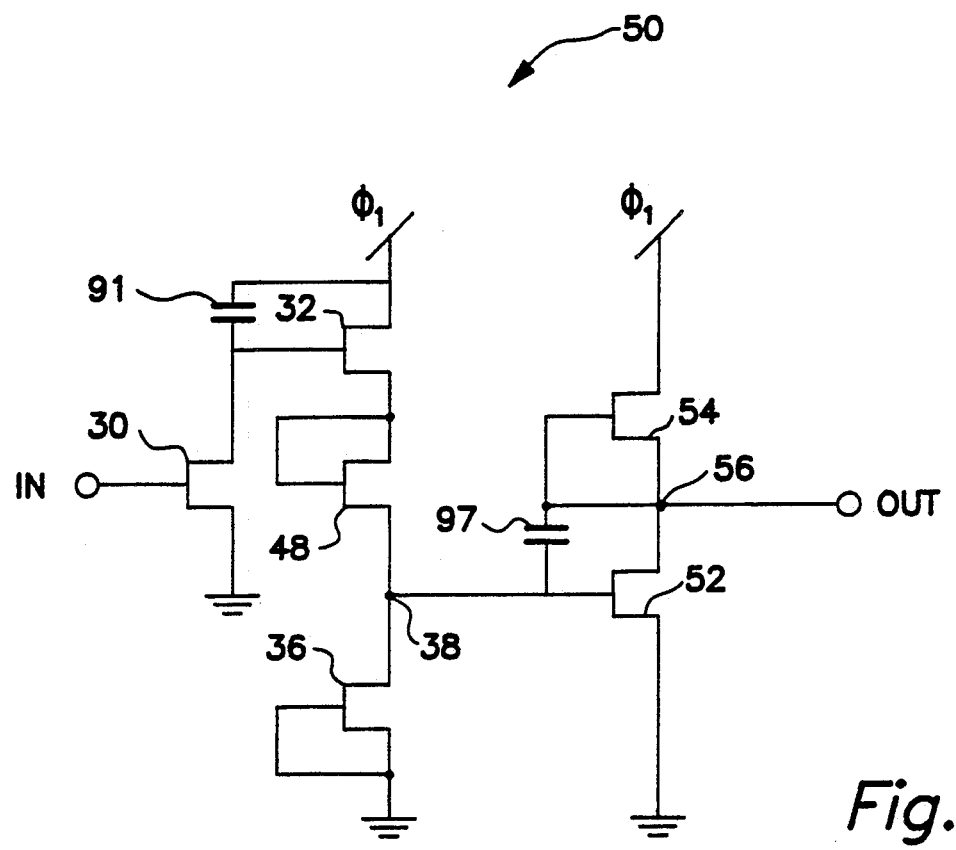
FIG. 3 is a schematic of the invention having a special inverter.

FIG. 1 shows hot clock logic 10 for the Boolean operation of AC+BD. FETs 12 and 16 are connected in series, that is, the source of FET 12 is connected to the drain of FET 16. The logic inputs A and C are connected to the gates of FETs 12 and 16, respectively. The resultant logic NAND function $\overline{A \cdot C}$ of inputs A and C at the drain of FET 12, which is inputted to the gate of FET 20. Similarly inputs B and D to FETs 14 and 18, respectively, result in a NAND output $\overline{B \cdot D}$ at the drain of FET 14, which goes to the gate of FET 20. However, at node 22, which is bootstrapped, the drains of FETs 12 and 14 are connected together thereby tying together outputs $\overline{A \cdot C}$ and $\overline{B \cdot D}$ with a NOR logic function resulting in an AND logic function result of $$\overline{(A \cdot C)} \cdot \overline{(B \cdot D)}$$

which is equivalent to $$A \cdot C + B \cdot D,$$

via DeMorgan's theorem, at the gate of FET 20.

The principle of hot clock operation is based on bootstrapping of the potential at node 22 by the rising edge of a clock signal. The bootstrapping is caused by the parasitic capacitance between the gate and the drain of FET 20 and an optional capacitance 68. When the potential of node 22 is not connected by FETs 12, 14, 16 or 18 to ground, source follower FET 20 can turn on when the input voltage (node 22) rises (the output 38 goes to a high state—waveform 37). If at least FETs 12 and 16 or 14 and 18 are on, the gate of FET 20 (node 22) is clamped to ground. Then the bootstrapping is overcome and FET 20 stays off. Thus output node 24 is pulled to $V_{ss}$ or another reference voltage by FET 28 (output 38 goes to a low state—waveform 39). Capacitances 82, 91, 93, 95, 97, 101 and 102 of FIGS. 1–6 contribute to bootstrapping similarly as capacitance 68.

Circuit 11 of FIG. 1 shows another configuration for input signals at E, F, G and H for the Boolean operation of $$\overline{(E + F) \cdot (G + H)}.$$

E, F, G and H are individual inputs to the gates of transistors 13, 15, 17 and 19, respectively. Node 23 can be connected to the gate of transistor 20. If circuit 11 is connected to the gate of transistor 20, then the resultant operation would be $$\overline{(E + F) \cdot (G + H)}$$

at the output on node 38 in FIG. 1.

FET 20 has its drain connected to the $\phi_1$ clock thereby pulsing its output as a source-follower comprising resistor 26 and FET 28 at node 24, the logic function output being $$\overline{A \cdot C + B \cdot D}.$$

Resistive element 26 may be substituted with a FET like that of FET 48 and its connection configuration in FIG. 3.

The pulsed output of node 24 is connected to the gate of FET 30. The output at the drain of FET 30 is an inverted signal of that at the gate of FET 30, that is, $A \cdot C + B \cdot D$. The output is connected to the gate of FET 32. The drain of FET 32 is connected to the $\phi_2$ clock which pulses FET 32 with a supply voltage. FET 32 functions as a source-follower comprising resistor 34 and FET 36 in series, having node 38 providing as an output the non-inverted signal of that at the gate of FET 32. Resistive element 34 may be substituted with a FET like that of FET 48 and its connection configuration in FIG. 2. Yet the output is pulsed with an overlap of two clocks $\phi_1$ and $\phi_2$, the output pulse being at the region of overlap of the clock pulses $\phi_1$ and $\phi_2$. The period of the clocks may be about 600 picoseconds.

Signal 37 is at node 38 when the logic output is a high ("1"). Signal 39 is at node 38 when the logic output is a low ("0"). $V_{ss}$ typically is about $-0.5$ volt and the clock signal amplitudes range from $-0.5$ volt to $+1.5$ volts. Signal 37 typically varies from $-0.5$ volt to just a little over zero volt and signal 39 typically varies from $-0.5$ volt to $-0.25$ volt, respectively.

Input buffer circuit 40 is shown in FIG. 2. FET 30 of FIG. 2 corresponds to FET 30 of FIG. 1. FET 46 is connected in series with FET 30 and is where feedback of the $\phi_2$ clock signal is introduced. The drain of FET 46 that outputs an inverted signal of the input to FET 30 along with some amplitude of the feedback $\phi_2$ clock signal. The drain of FET 46 is connected to the gate of FET 32 which corresponds to FET 32 of FIG. 1. The $\phi_2$ clock signal feedback to FET 46 is from node 47 and which in turn has passed through FET 42 which has the gate connected to its source. Node 47 is connected to ground through FET 44 having a gate connected to the source. The source of FET 42 is connected to the drain of FET 44 which has a gate and a source connected to ground or a zero reference voltage. The output at node 38 is that of FET 32 acting effectively as a source-follower. Node 38 is positioned between FET 48 which corresponds to resistor 34 of FIG. 1, and FET 36 which corresponds to FET 36 of FIG. 1. In FIG. 2, FET 48 has a gate connected to its drain and FET 36 of FIG. 2 has a gate connected to its source. Input buffer 40 of FIG. 2 has feedback to FET 46 to prevent unallowed output transitions (that is, a non-leading-edge triggered output).

Non-inverting buffer 50 in FIG. 3 together with an inverter can generate data and data signals from domino logic driven by the $\phi_2$ clock. FET 30 corresponds to FETs 30 in FIGS. 1 and 2. The logic output signal from node 24, which is pulsed by the $\phi_1$ clock, goes to the gate of FET 30. The inverted output goes on to FET 32 which corresponds to FETs 32 of FIGS. 1 and 2. The output of FET 32 is at node 38, and is like that of a source-follower. FETs 48 and 36 function as a voltage-divider for the output from the source of FET 32 to $V_{ss}$ may have a voltage potential of the reference or ground. FET 48 corresponds to FET 48 of FIG. 2 and to resistor 34 of FIG. 1. At node 38 is an inversion of the input signal at the gate of transistor 30. Node 38 is connected to the gate of transistor 52 which inverts the signal at node 56. Thus, the input signal at the gate of transistor 30 is non-inverted at the output of node 56. Transistor 54, having its gate connected to its source, is an active resistive element between the drain FET 52 and clock $\phi_1$. Any information transfer occurs only on the leading edge of the clock signal in circuit 50.

Figure 4:
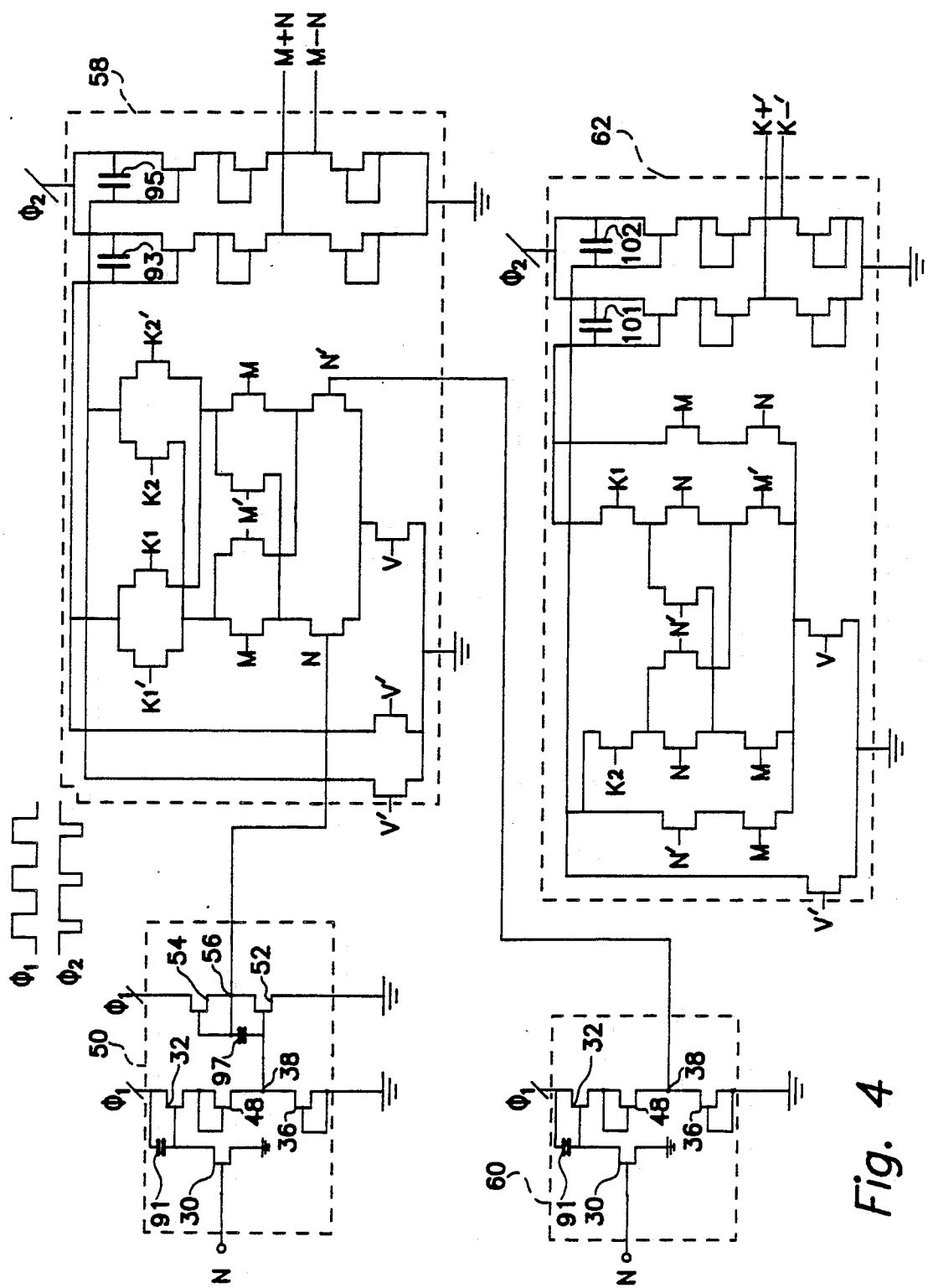
FIG. 4 is an adder and subtractor with carry circuitry, implemented in hot clock logic.

FIG. 4 is an application of the hot clock logic invention to complex circuitry. Adder and subtractor 58 is implemented in hot clock logic for signals M and N. The add and subtract carries $K_1'$ and $K_2'$ are generated in circuit 62 as $K+'$, and $K-'$, respectively. $K_1$ and $K_2$ have inputs which are inverted relative to $K_1$, and $K_2$, inputs, respectively. M' and N' inputs are for inverted M and N signals. V and V' are the enable and disable inputs. Circuits 50 and 60 may be used for non-inverting and inverting inputs of M, K and V, FIG. 4 is shown in FIG. 3 and described above. Circuit 60 is the first stage of circuit 50. FIG. 6, like FIG. 4, shows an application of the hot clock logic of FIG. 5 to complex circuitry.

Figure 5:
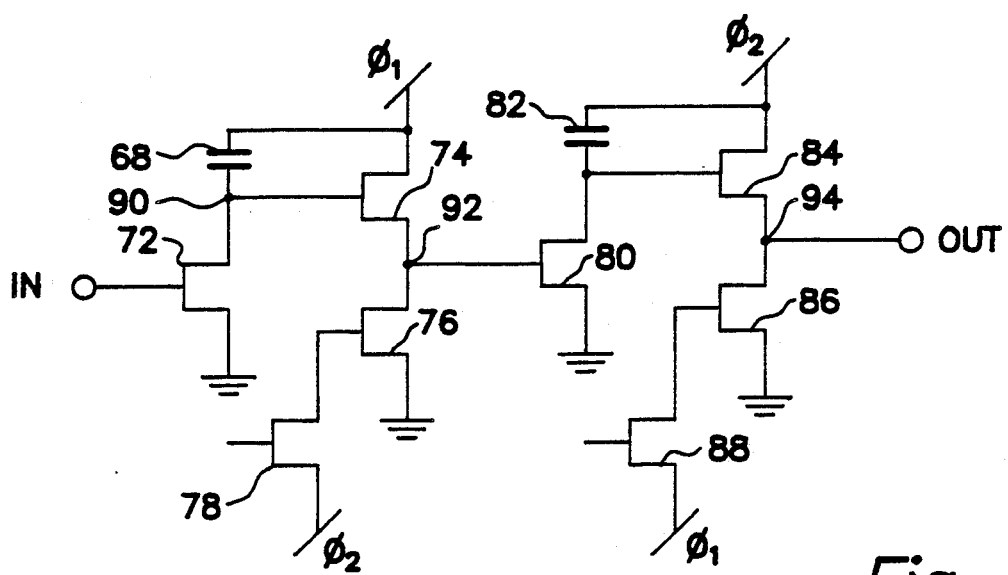
FIG. 5 is a schematic of the invention particularly adaptable to modulation doped FET technology.
Figure 6:
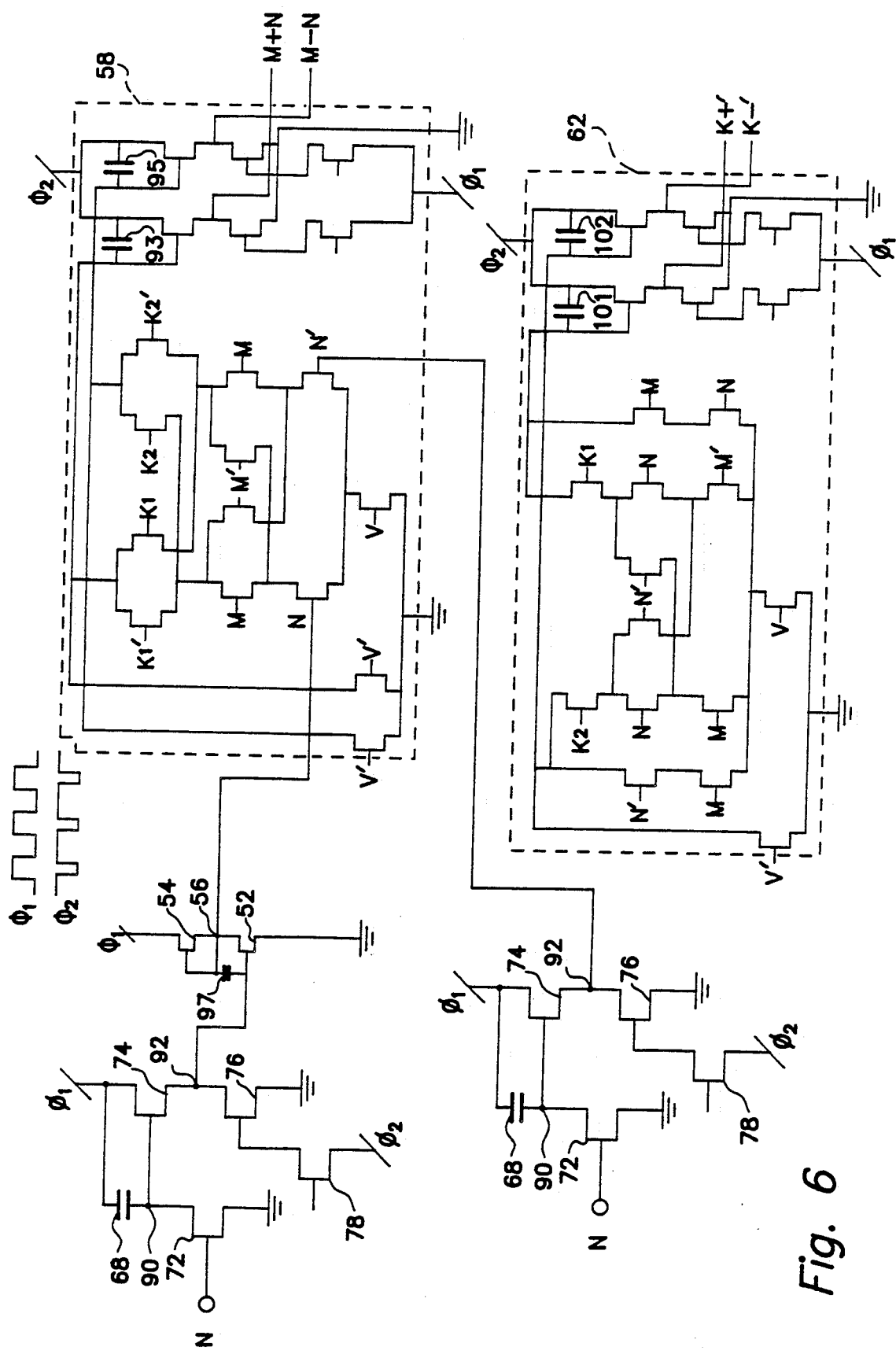
FIG. 6 is an implementation of hot clock logic.

FIG. 5 shows circuit 70 of the present invention that implements modulation doped FET (MODFET) technology. A logic signal may be inputted to a gate of transistor 72 which has a source connected to a zero reference voltage, and a drain connected to a gate of transistor 74. The principle of hot clock logic operation is effected with the bootstrapping of the potential at node 90 by the rising edge of the clock first $\phi_1$. Such bootstrapping is caused by the parasitic capacitance between the gate and drain of FET 74 and an optional capacitance 68. The logic signal at the gate of FET 72 is inverted at node 90 and the signal remains inverted at node 92 as FET 74 functions as a source follower having a drain connected to the first clock $\phi_1$ and a source connected to a current control circuit incorporating FETs 76 and 78. FET 76 has a drain connected to node 92 and a source connected to the zero reference voltage. FET 78 has a drain connected to a gate of FET 76, a source connected to a second clock $\phi_{12}$, and an open gate. Node 92 is connected to a gate of FET 80. FET 80 has a drain connected to a gate of FET 84 and source connected to the zero reference voltage. Capacitor 82 is connected across the gate and drain of FET 84. The drain of FET 84 is connected the second clock $\phi_2$. The logic signal at the gate of FET 84 is an inversion of the signal at node 92. The signal is not inverted by FET 84 as FET 84 functions as a source follower, and the signal at output node 94 is a non-inverted, hot clock version of the input signal at the gate of FET 72. The source of FET 84 is connected to current control circuitry having FETs 86 and 88. The source of FET 84 is connected to a drain of FET 86. A source of FET 86 is connected to the zero reference voltage, and a drain of FET 88 is connected to a gate of FET 86. FET 88 has a source connected to the first clock $\phi$ and has an open gate.

All the circuitry of FIGS. 1-5 described above and claimed below may be implemented as optical, electrical and other types of circuitry, incorporating various media and substrates.

We claim:

1. A very high frequency hot clock logic circuit that functions solely on power from clock signals and performs logic operations at rising edges of the clock signals, comprising:
   first switching means, connectable to reference means, for receiving input signals for said logic circuit;
   second switching means, connected to said first switching means and connectable to first clock means, for receiving signals from said first switching means;
   first coupling means, connected to said second switching means and connectable to the first clock means, for coupling clock signals to said first switching means;
   first variable attenuating means, connectable to second clock means, for receiving clock signals,
   third switching means, connected to said second switching means and first variable attenuating means, and connectable to the reference means, for receiving signals from said first variable attenuating means; and
   first output means, connected to said second and third switching means, for outputting signals from said second and third switching means.

2. Circuit of claim 1 further comprising:
   fourth switching means, connected to said output means and connected to the reference means, for receiving signals from said first output means;
   fifth switching means, connected to said fourth switching means and connectable to the second clock means, for receiving signals from said fourth switching means;
   second coupling means, connected to said fifth switching means and connectable to the second clock means, for coupling clock signals to said fourth switching means;
   second variable attenuating means, connectable to the first clock means, for receiving clock signals;
   sixth switching means, connected to said fifth switching means and to said second attenuating means, and connectable to the reference means; and second output means, connected to said fifth and sixth switching means, for outputting signals from said fifth and sixth switching means.

3. A very high frequency hot clock logic circuit that functions solely on power from clock signals and performs logic operations at rising edges of the clock signals, comprising:

a first transistor having a first terminal as an input, having a third terminal connected to a reference, and having a second terminal;

a second transistor having a first terminal connected to the second terminal of said first transistor, having a second terminal connected to a first clock, and having a third terminal;

a first capacitor having a first terminal connected to the second terminal of said second transistor and having a second terminal connected to the first terminal of said second transistor;

a third transistor having a second terminal connected to the third terminal of said second transistor, having a third terminal connected to the reference, and having a first terminal; and a fourth transistor having a second terminal connected to the first terminal of said third transistor, having a third terminal connected to a second clock, and having a first terminal.

4. Circuit of claim 3 further comprising:

a fifth transistor having a first terminal connected to the third terminal of said second transistor, having a third terminal connected to the reference, and having a second terminal;

a sixth transistor having a first terminal connected to the second terminal of said fifth transistor, having a second terminal connected to the second clock and having a third terminal as an output;

a second capacitor having a first terminal connected to the second terminal of said sixth transistor and having a second terminal connected to the first terminal of said sixth transistor;

a seventh transistor having a second terminal connected to the third terminal of said sixth transistor, having a third terminal connected to the reference, and having a first terminal; and an eighth transistor having a second terminal connected to the first terminal of said seventh transistor, having a third terminal connected to the first clock, and having a first terminal.

5. Circuit of claim 4 wherein:

the first clock is a periodic signal having a rising edge and a falling edge; and the second clock is a periodic signal having a falling edge and a rising edge, occurring in that order, between the rising edge and the falling edge, in that order, of the first clock.

6. A very high frequency hot clock logic circuit that functions solely on power from clock signals and performs logic operations at rising edges of the clock signals, comprising:

a first transistor having a first terminal as a first input, having a third terminal connected to a reference, and having a second terminal;

a second transistor having a first terminal connected to the second terminal of said first transistor, having a second terminal connected to a first clock, and having a third terminal;

a first capacitor having a first terminal connected to the second terminal of said second transistor and having a second terminal connected to the first terminal of said second transistor;

a third transistor having a second terminal connected to the third terminal of said second transistor, having a third terminal connected to the reference, and having a first terminal;

a fourth transistor having a second terminal connected to the first terminal of said third transistor, having a third terminal connected to a second clock, and having a first terminal;

a fifth transistor having a first terminal connected to the third terminal of said second transistor, having a second terminal as a first output, and having a third terminal connected to the reference;

a sixth transistor having first and third terminals connected to the second terminal of said fifth transistor, and having a second terminal connected to the first clock; and a second capacitor having a first terminal connected to the third terminal of said sixth transistor and having a second terminal connected to the first terminal of said fifth transistor.

7. Circuit of claim 6 further comprising:

a seventh transducer having a first terminal as a second input, having a third terminal connected to a reference, and having a second terminal;

a eighth transistor having a first terminal connected to the second terminal of said seventh transistor, having a second terminal connected to a first clock, and having third terminal as a second output;

a third capacitor having a first terminal connected to the second terminal of said eighth transistor and having a second terminal connected to the second terminal of said seventh transistor;

a ninth transistor having a second terminal connected to the third terminal of said eighth transistor, having a third terminal connected to the reference, and having a first terminal; and a tenth transistor having a second terminal connected to the first terminal of said ninth transistor, having a third terminal connected to the second clock, and having a first Germinal.

8. Circuit of claim 7 wherein:

the first clock is a periodic signal having a rising edge and a falling edge; and the second clock is a periodic signal having a falling edge and a rising edge, occurring in that order, between the rising edge and the falling edge, in that order, of the first clock.

9. Circuit of claim 8 further comprising:

an adder/subtractor, connected to the first and second outputs, to the first and second clocks, and to the reference, having hot clock circuitry, a plurality of inputs, and adder/subtract outputs; and a carry circuit, connected to said adder/subtractor, to the first and second clocks, and to the first reference, having hot clock circuitry.

10. A very high frequency hot clock logic circuit that functions solely on power from clock signals and performs logic operations at rising edges of the clock signals, comprising:

a first transistor having a first terminal as a first input, a third terminal connectable to a reference, and having a second terminal;

a second transistor having a first terminal connected to the second terminal of said first transistor, having a second terminal connectable to a first clock, and having a third terminal;

a first level shifting element having a first terminal connected to the third terminal of said second transistor and having a second terminal;

a first current limiting element having a first terminal connected to the second terminal of said first level shifting element, and having a second terminal connectable to the reference;

a third transistor having a first terminal connected to the second terminal of said first level shifting element, having a third terminal connectable to the reference, and having a second terminal as a first output;

a second current limiting element having a second terminal connected to the second terminal of said third transistor, and having a first terminal connectable to the first clock;

a fourth transistor having a third terminal connectable to the reference, and having a first terminal as a second input and having a second terminal;

a fifth transistor having a first terminal connected to the second terminal of said fourth transistor, having a second terminal connectable to the first clock, and having a third terminal;

a second level shifting element having a first terminal connected to the third terminal of said fifth transistor and having a second terminal as a second output;

a third current limiting element having a first terminal connected to the second terminal of said fourth resistive element, and having a second terminal connectable to the reference;

a first capacitor having first and second terminals connected to the first and second terminals, respectively, of said second transistor;

a second capacitor having first and second terminals connected to the first and second terminals, respectively, of said third transistor; and a third capacitor having first and second terminals connected to the first and second terminals, respectively, of said fifth transistor.

11. Apparatus of claim 10 further comprising:

an adder/subtractor, connected to the first and second outputs, to a second clock, and to the reference, and having hot clock logic circuitry, a plurality of inputs, and add/subtract outputs; and a carry circuit, connected to said adder/subtractor, to the second clock, and to the reference, and having hot clock circuitry.

12. Apparatus of claim 11 wherein:

said first level shifting element is a sixth transistor having first and second terminals connected to the third terminal of said second transistor, and having a third terminal connected to the first terminal of said third transistor;

said first current limiting element is a seventh transistor having a second terminal connected to the third terminal of said sixth transistor, and having first and third terminals connectable to the reference;

said second current limiting element is an eighth transistor having first and third terminals connected to the second terminal of said third transistor, and having a second terminal connectable to the first clock;

said second level shifting element is a ninth transistor having first and second terminals connected to the third terminal of said fifth transistor, and having a third terminal connected to the second output; and said third current limiting element is a tenth transistor having a second terminal connected to the third terminal of said ninth transistor, and having first and third terminals connectable to the reference.

* * * * *

UNITED STATES PATENT AND TRADEMARK OFFICE
CERTIFICATE OF CORRECTION

PATENT NO. : 4,996,454

DATED : February 26, 1991

INVENTOR(S) : Andrezj Peczalski, Julio C. Costa; Jeffrey S. Conger

It is certified that error appears in the above-identified patent and that said Letters Patent is hereby corrected as shown below:

Column 6, line 42, delete "Germinal" and substitute
 -- terminal --

Signed and Sealed this

Seventh Day of July, 1992

*Attest:*

DOUGLAS B. COMER

*Attesting Officer*     Acting Commissioner of Patents and Trademarks